(12) United States Patent
Norton et al.

(10) Patent No.: US 10,339,856 B1
(45) Date of Patent: Jul. 2, 2019

(54) TILE WITH DISPLAY MODULES

(71) Applicant: Cleveland Reclaim Industries, Inc., Lorain, OH (US)

(72) Inventors: Tom Norton, Bay Village, OH (US); Michael W. Jackson, Wooster, OH (US)

(73) Assignee: Cleveland Reclaim Industries, Inc. d/b/a Turtle Plastics, Lorain, OH (US)

( * ) Notice: Subject to any disclaimer, the term of this patent is extended or adjusted under 35 U.S.C. 154(b) by 0 days.

(21) Appl. No.: 15/421,491

(22) Filed: Feb. 1, 2017

Related U.S. Application Data

(60) Provisional application No. 62/289,497, filed on Feb. 1, 2016.

(51) Int. Cl.
  *G09G 3/32* (2016.01)
  *H01L 27/15* (2006.01)
  *H01R 31/00* (2006.01)

(52) U.S. Cl.
  CPC ............. *G09G 3/32* (2013.01); *H01L 27/153* (2013.01); *H01R 31/005* (2013.01); *G09G 2300/026* (2013.01); *G09G 2330/02* (2013.01); *G09G 2380/02* (2013.01)

(58) Field of Classification Search
  CPC ....... G09G 3/32; H01L 27/153; H01R 31/005
  See application file for complete search history.

(56) References Cited

U.S. PATENT DOCUMENTS

| | | | | |
|---|---|---|---|---|
| 6,150,996 A | * | 11/2000 | Nicholson | G09F 9/33 345/1.3 |
| 8,840,284 B1 | * | 9/2014 | Hochman | H05K 7/12 362/217.12 |
| 2007/0262933 A1 | * | 11/2007 | Streitz | G09F 9/33 345/82 |
| 2012/0019490 A1 | * | 1/2012 | Huang | G09G 3/32 345/205 |
| 2012/0182739 A1 | * | 7/2012 | Leung | F21S 2/005 362/249.06 |
| 2016/0035924 A1 | * | 2/2016 | Oraw | H01L 31/0508 136/244 |
| 2016/0224306 A1 | * | 8/2016 | Rycyna, III | G09G 3/32 |

* cited by examiner

*Primary Examiner* — Ariel A Balaoing
(74) *Attorney, Agent, or Firm* — Calfee, Halter & Griswold, LLP

(57) ABSTRACT

Tiles with lighting modules, including a plate with a plurality of through holes and at least one display module.

20 Claims, 5 Drawing Sheets

TILE WITH DISPLAY MODULES

CROSS-REFERENCE TO RELATED APPLICATIONS

The present application claims priority to, and any other benefit of, U.S. Provisional Pat. Appl'n Ser. No. 62/289,497, filed Feb. 1, 2016, the entire disclosure of which is incorporated herein by reference as though recited herein in its entirety.

BACKGROUND

The present subject matter relates to the field of tiles and, more specifically, to a tile and plurality of tiles with display modules.

Tiles made by recycling materials are popular for using at wet environments. Because they are resistant to oils, solvents, acids, and many other chemicals, these tiles are safe, sanitary and easy to clean.

SUMMARY

The present application discloses a tile with display modules.

An exemplary tile comprises: a plate having a top side, a bottom side, and a plurality of through holes, wherein the bottom side comprises at least one recess, configured to receive a display module, and at least two connectors disposed at an edge of the plate and each configured to receive a cable connector, wherein the connector is configured to interlock a connector of another tile, and wherein the cable connector is electrically coupled to a cable connector disposed in another tile when the connector of the tile interlocks to a connector of an adjacent tile.

Another exemplary tile with display modules comprises: a plate having a top side, a bottom side, and a plurality of through holes, wherein the bottom side comprises at least one recess, at least two connectors disposed at an edge of the plate, wherein the connector is configured to interlock a connector of another tile, at least one display module, removably fitting into the recess and operationally emitting lights, and a cable, electrically and removably coupling to the display module, wherein the cable comprises two cable connectors configured to respectively couple to two connectors, and wherein the display module is able to emit lights through the through holes when the display module fits into the recess, and wherein the cable connector is electrically coupled to a cable connector disposed in another tile when the connector of the tile interlocks to a connector of an adjacent tile.

An exemplary system of tiles with display modules comprises a plurality of tiles with display modules, each comprising: a plate having a top side, a bottom side, and a plurality of through holes, wherein the bottom side comprises at least one recess, at least two connectors disposed at an edge of the plate, wherein the connector is configured to interlock a connector of another tile, at least one display module, removably fitting into the recess and operationally emitting lights, and a cable, electrically and removably coupling to the display module, wherein the cable comprises two cable connectors configured to respectively couple to two connectors, and a power source controller, removably coupling to a cable connector of the tile and programmably controlling the display modules of the tiles, and wherein the display module is able to emit lights through the through holes when the display module fits into the recess, and wherein the cable connector is electrically coupled to a cable connector disposed in another tile when the connector of the tile interlocks to a connector of an adjacent tile.

Another system of tiles with display modules comprises a plurality of tiles with LED modules, each comprising: a plate having a top side, a bottom side, a first, second, third, and fourth edges, and a plurality of through holes, wherein the bottom side comprises seven double recesses and one single recess, the first and third edges are the opposite edges, and the second and fourth edges are the opposite edges, two T-shaped male connectors disposed at the first edge of the plate, two T-shaped male connectors disposed at the second edge of the plate, two female connectors disposed at the third edge of the plate and configured to receive a T-shaped male connector of another tile, two female connectors disposed at the fourth edge of the plate and configured to receive a T-shaped male connector of another tile, one single LED module, removably fitting into the single recess and operationally emitting lights, seven double LED modules, removably fitting into the double recesses and operationally emitting lights, wherein the LED modules are able to emit lights through the trough holes when the LED modules fit into the recesses, and wherein the LED modules are flexible, plastic coated and water resistant, and a cable, electrically and removably coupling to the LED modules, wherein the cable comprises a male cable connector and a female cable connector, the male cable connector is disposed in the female connector of the plate, the female cable connector is disposed in the male connector of the plate, and wherein the male cable connector is electrically coupled to an female cable connector of another tile when the female connector of the plate interlocks to an male connector of an adjacent tile, and a power source controller, removably coupling to a cable connector of the tile, providing power to the LED modules, and programmably controlling the display modules of the tiles, wherein the power source controller comprises a transformer module to covert AC into DC.

DETAILED DESCRIPTION

Figure 1:
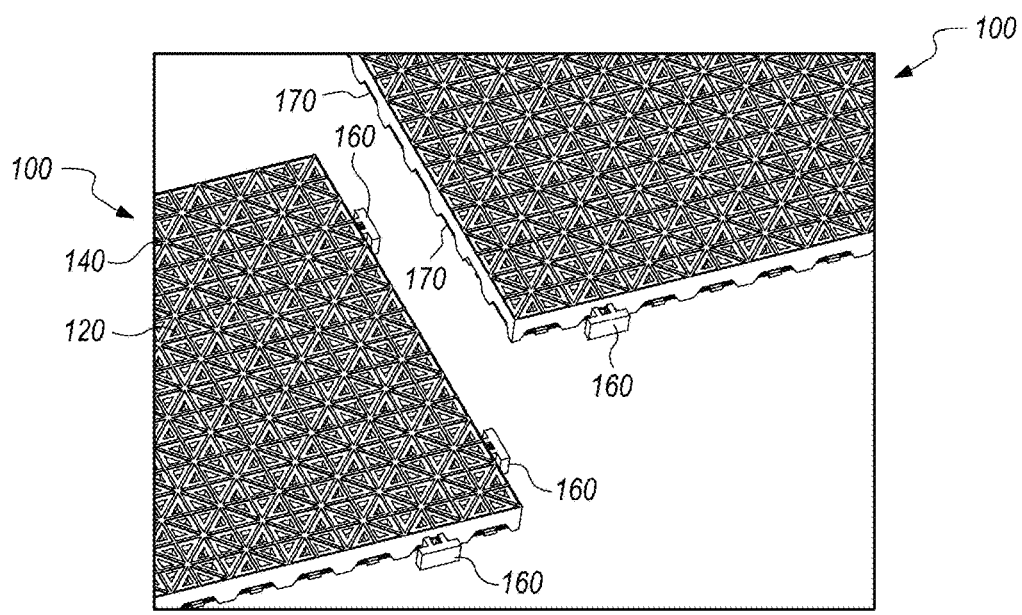
FIG. 1 is a side/top perspective view of an exemplary set of tiles of the present application.
Figure 2:
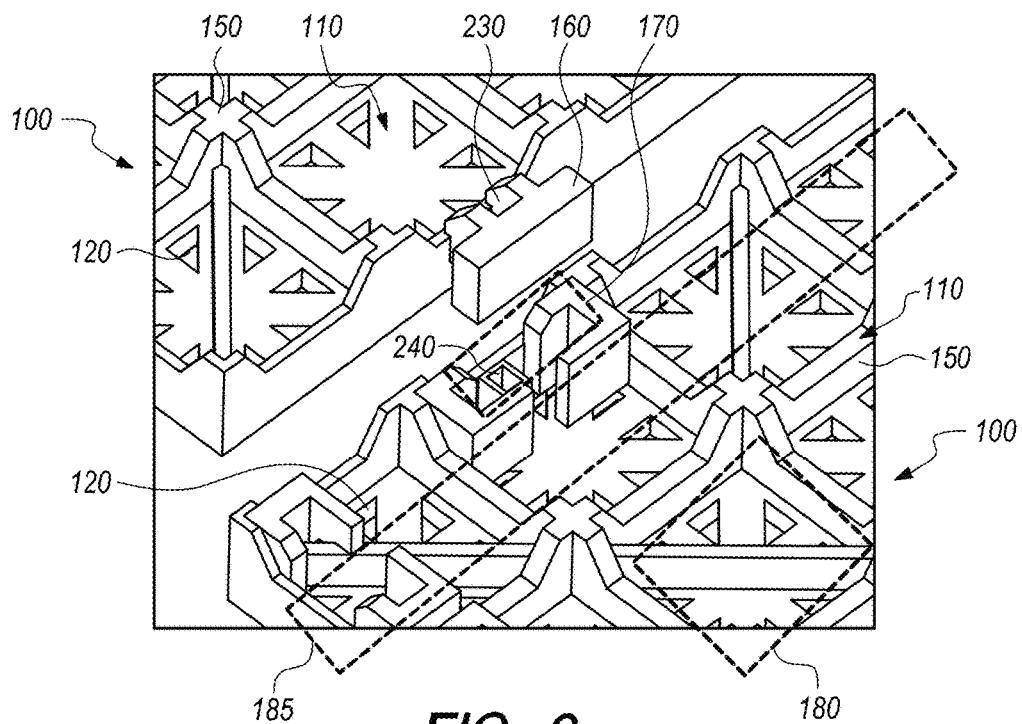
FIG. 2 is a side/bottom perspective view of an exemplary set of tiles.

This Detailed Description merely describes exemplary embodiments of the invention and is not intended to limit the scope of the claims in any way. Indeed, the invention as claimed is broader than the exemplary embodiments, and the terms used in the claims have their full ordinary meaning, unless an express definition is provided herein.

As taught herein and refer to FIGS. 1-7, the present subject matter describes a tile with display modules 100, comprising a plate 110 with a plurality of through holes 120 and at least one display module 130. The through holes 120 are configured to prevent water or other fluids from accumulating on the surface of the tile 100 so that to increase the safety of the wet environment. Additionally, the through holes 120 also permit light from the display modules 132 shine up through the plate 110. The exemplary plates 110 comprise a top side 140 and a bottom side 150. A person skilled in the art should reasonably understand that the plate could be any shapes configured to connect to another adjacent plate, which may or may not have the same shape, including but not limited to triangle, rectangular, square, and hexagon. In some exemplary embodiments, the plates 110 are square.

Looking at the side back of the exemplary plate 110 (e.g., FIG. 2), the exemplary exemplary plates 110 comprise at least one male connector 160 and at least one female connector 170. In some exemplary embodiments, the exemplary plates 110 comprise four male connectors 160 and four female connectors 170. In an embodiment, two male connectors 160 are disposed on each of two adjacent edges and two female connectors 170 are disposed on each of another two adjacent edges. In another embodiment, one male connector and one female connector are disposed on each edge. The male connectors 160 are configured to couple to the female connectors 170 of another plate 110. The female connectors 170 are configured to couple to the male connectors 160 of another plate 110. The male connector 160 and the female connector 170 are configured to interlock each other to physically connect adjacent tiles as well as electrically connect LED modules of adjacent tiles. The tiles 100 are able to be disposed in a substantially even plane when the tiles 100 are connected each other.

The bottom side 150 of the exemplary plates 110 comprise at least one recess 180 or 185. The display module 130 is configured to be pressed fit into the recess 180 or 185. In an alternative embodiment, the display module 130 is configured to be snapped into the recess 180 or 185. Optionally, the tile 100 further comprises a retaining plate (not shown). The retaining plate is configured to couple with the bottom side 150 of the plate 110 and to maintain the display module 130 within the recess 180 or 185.

The display module 130 comprises a base 188 and a plurality of light emitting elements 190 (e.g., LEDs) disposed on or embedded in the base 188. The locations of the light emitting elements 190 match the locations of the through holes 120 of the plate 110 so that the through holes 120 of the plate 110 allow light to be emitted out of the top side 140 of the plate 110. In exemplary embodiments, the light emitting elements 190 emit the same colored lights. In other exemplary embodiments, the light emitting elements 190 emit different colored lights. In other exemplary embodiments, one light emitting element 190 is able to emit multiple colored lights. In some exemplary embodiments, the display module 130 is flexible. In some exemplary embodiments, the display module 130 is plastic coated, potted, or otherwise water resistant.

In an embodiment, the display module 130 is an LED module and the light emitting elements 190 are LEDs. A person skilled in the art should reasonably understand that the display module can be other kinds of know illumining devices, including but not limited to incandescent bulbs, electro-luminescent strips, etc. In an embodiment, the display module 130 comprises a square LED module 130. Optionally, the tile 100 comprises sixty square recesses 180 and sixty the square LED modules 130. In another embodiment, the display module 150 comprises an LED strip 135, e.g., a printed circuit board with LEDs and driver circuits mounted thereon in electrical circuit communication as known to those skilled in the art. Optionally, the tile 100 comprises eight LED strip 135 and eight recesses 185. Optionally, the eight LED strip 135 comprise seven double LED strip and one single LED strip.

Figure 3:
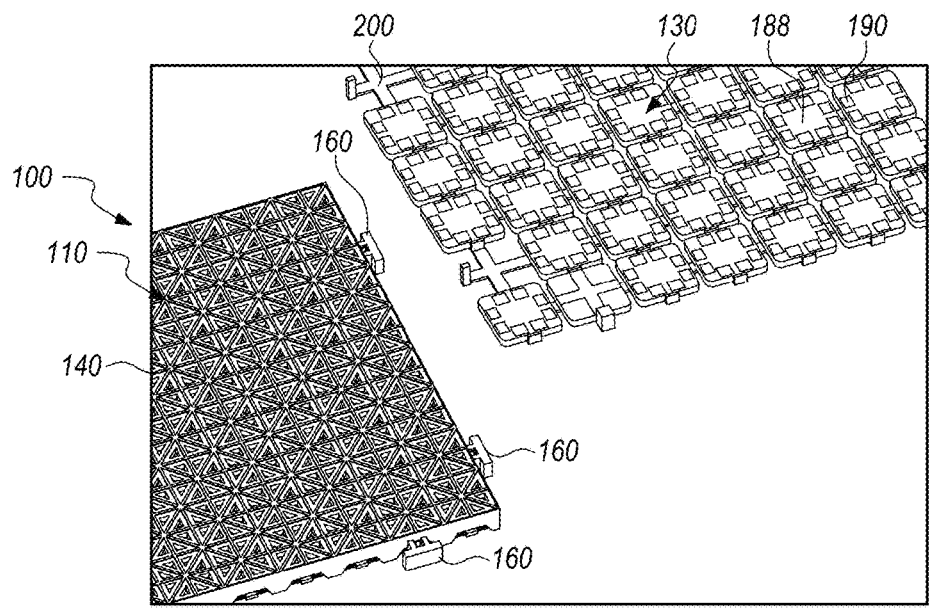
FIG. 3 is a side/top perspective view of an exemplary tile with exemplary display modules.
Figure 4:
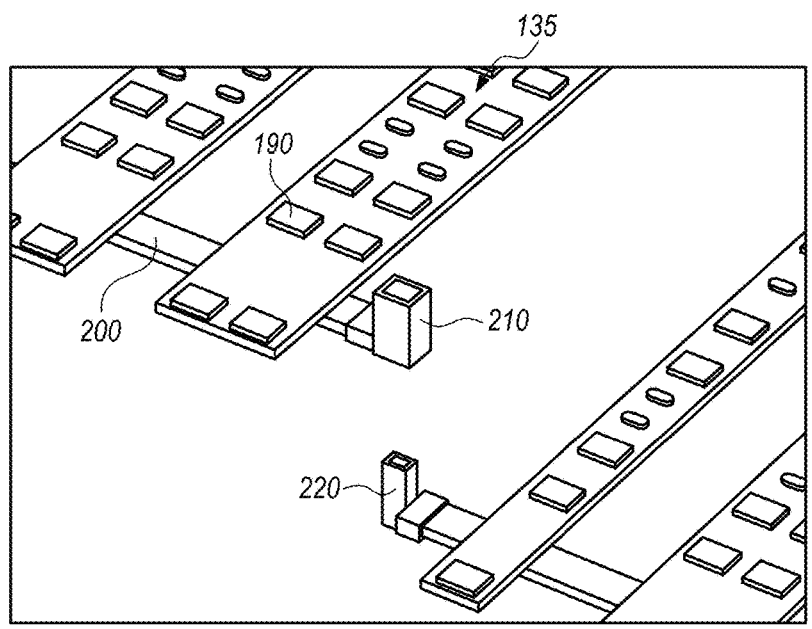
FIG. 4 is a side/top sectional view of an exemplary set of display modules and cables showing an exemplary set of physical connectors for providing electrical connections from one tile to an adjacent tile.
Figure 5:
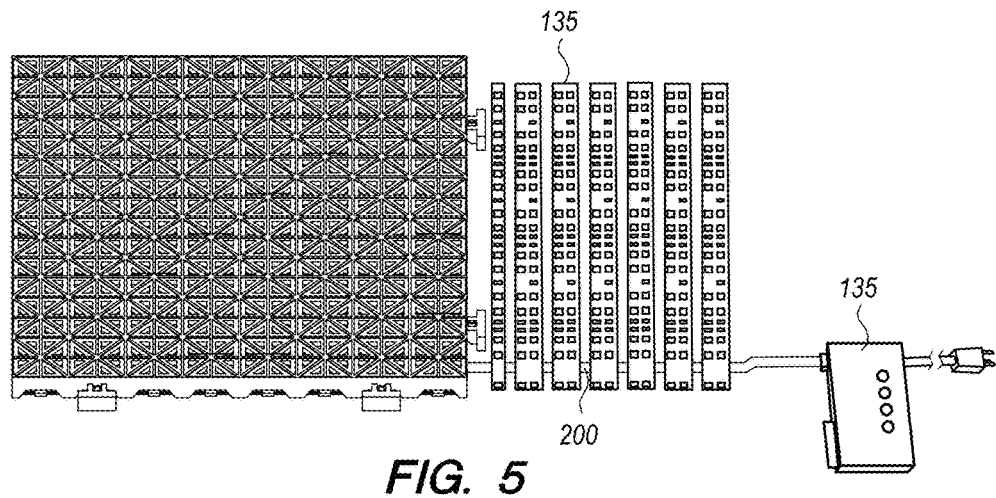
FIG. 5 is a side/top view of an exemplary tile, display modules from an adjacent tile (not shown), and of a power source/controller.

The tile 100 further comprises a cable 200. The cable 200 is configured to electrically couple to every display modules 130 of the tile 100. The cable 200 further comprises two ends connecting with another cable 200 of another adjacent tile 100 or with a power source controller 250. In an embodiment, the cable 200 is configured to electrically couple to at least one male connector 160 and at least one female connector 170. In some exemplary embodiments, when the male connector 160 of one tile 100 interlocks to the female connector 170 of another adjacent tile 100, the cables 200 of two tiles 100 are electrically coupled so that each tile can receive electrical power from an adjacent tile to power its display. In another embodiment, the cable 200 comprises a female cable connector 210 and a male cable connector 220. The female cable connector 210 is disposed in the recess 230 of the male connector 160 of the tile 100. The male cable connector 220 is disposed in the recess 240 of the female connector 170 of the tile 100. When a male connector 160 of a tile 100 interlocks to a female connectors 170 of another tile 100, the male cable connector 220 couples to the female cable connector 210. At the same time, the two cables 200 of the two tiles 100 are electrically connected so that each tile can receive electrical power from an adjacent tile to power its display. In an embodiment, the cable comprises a power cable and a control cable. In another embodiment, the cable transmits power signal and control signal in a signal cable. In some exemplary embodiments, e.g., as shown in FIG. 3, the male tile connectors 160 have female cable connector 210; female tile connectors 170 would thus have male cable connector 220.

Figure 8:
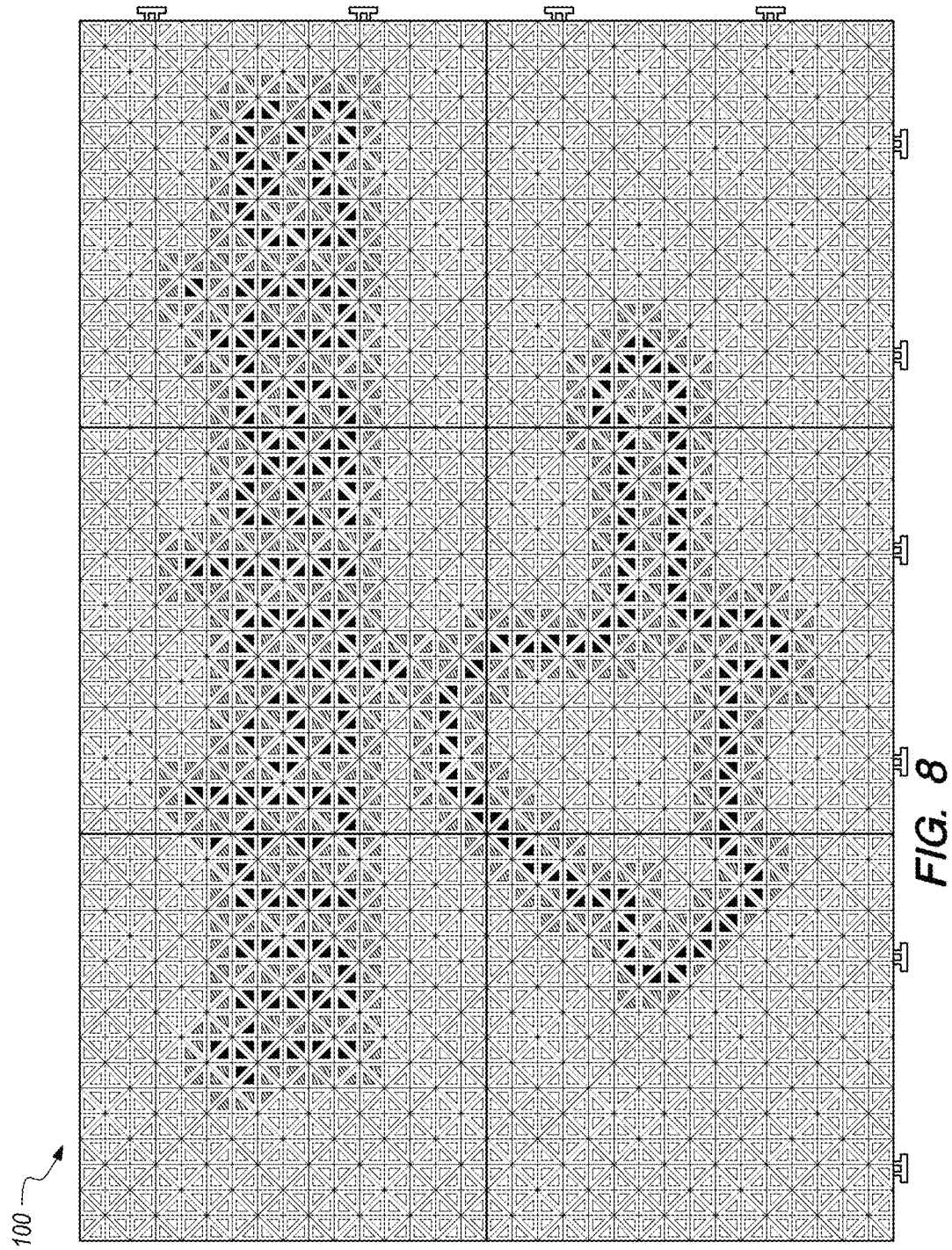
FIG. 8 is a side/top perspective view of an exemplary usage of nine tiles with respective display modules.

In order to provide power to tiles and control the tiles, the tile 100 connects to a power source controller 250. In exemplary power source controller 250 comprises a transformer module to covert AC power such as from a building wall or floor into DC voltage use to drive the light emitting units and power any control circuitry. In some exemplary embodiments, the power source controller 250 also is programmable to control which light emitting elements are ON (or to transmit communications signals to localized control units in one or more tiles to selectively control which light emitting elements are ON). In some exemplary embodiments, the power source controller 250 may provide power and control a total of 8 to 10 tiles, approximately 2000 LED's. A person skilled in the art should reasonably understand that the power source controller comprises any kind of micro controller, including but not limited to MCU and DSP. FIG. 8 shows that nine interlocking tiles 100 are powered and controlled by a power source controller (not shown). The lighted tiles 100 show colored characters of "turtleplastics" and a green turtle figure.

Figure 6:
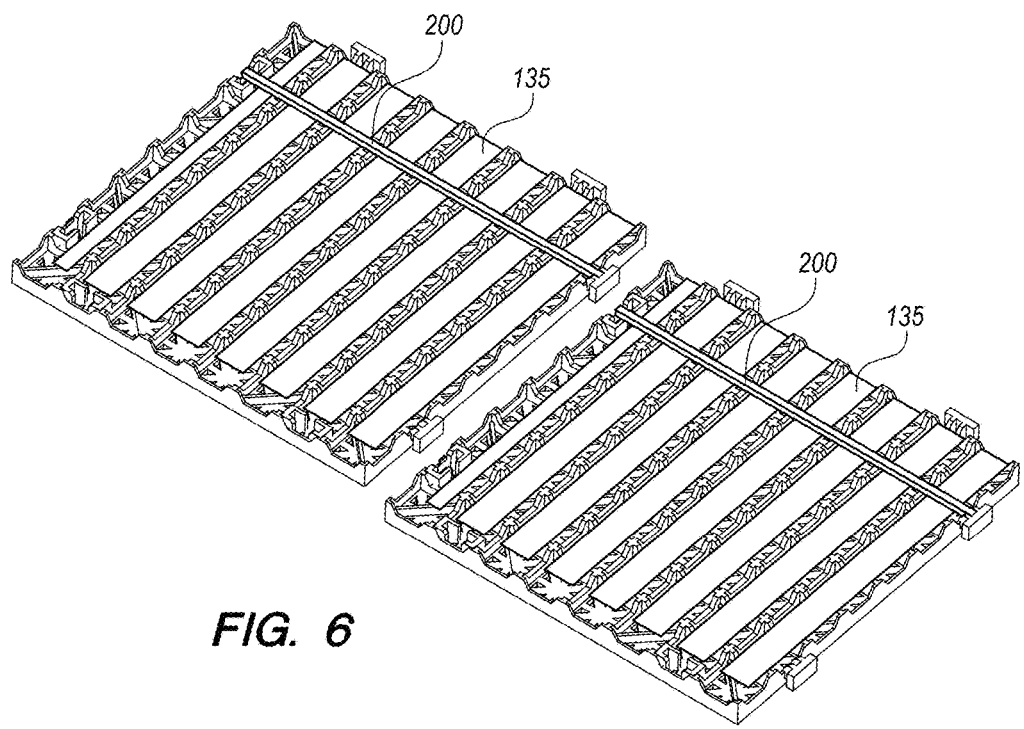
FIG. 6 is a side/bottom perspective view of an exemplary set of tiles, each having respective display modules, in the process of being electrically and physically connected.
Figure 7:
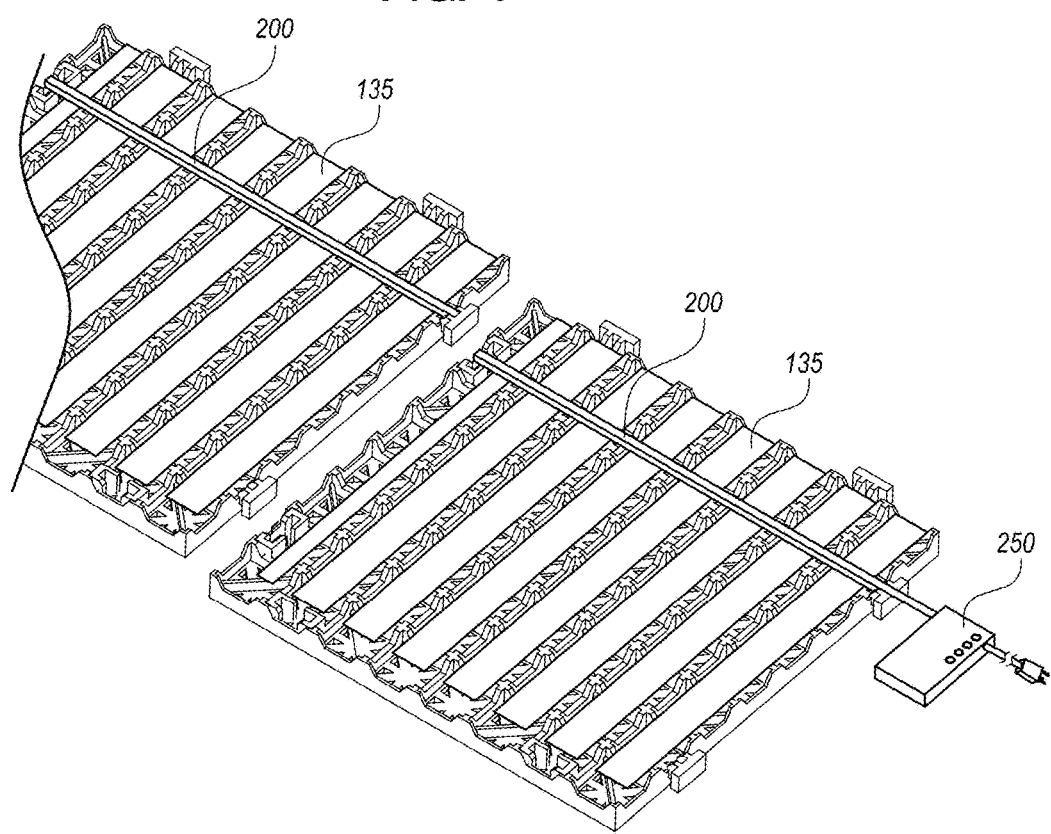
FIG. 7 is a side/bottom perspective view of the tiles and display modules of FIG. 6 with an exemplary power supply/control unit.

As shown best in FIGS. 6-7, the structure of the tiles includes a plurality of supports (with a + shaped contact point in this exemplary embodiment) that extend down between the recesses 180 or 185 so that the weight of the tiles from the top 140 of the tiles down to a support surface is supported by the tile down through to the supports, without requiring the modules 130, 135 to support any of the weight of the tiles or anything on the tiles.

While the present invention has been illustrated by the description of embodiments thereof, and while the embodiments have been described in considerable detail, it is not the intention of the applicants to restrict or in any way limit the scope of the invention to such details. Additional advantages and modifications will readily appear to those skilled in the art. For example, the steps of all processes and methods herein can be performed in any order, unless two or more steps are expressly stated as being performed in a particular order, or certain steps inherently require a particular order. Accordingly, departures may be made from such details without departing from the spirit or scope of the applicant's general inventive concept.

What is claimed is:

1. A tile, comprising:
    a plate having a top side, a bottom side, and a plurality of through holes, wherein the bottom side comprises at least one bottom recess, the at least one bottom recess configured to receive a display module that emits light through the plurality of through holes while received in the recess,
    at least two plate-to-plate connectors disposed at an edge of the plate and each plate-to-plate connector configured to physically connect the plate to an adjacent tile and each plate-to-plate connector having an electrical connector to electrically connect the plate to an adjacent tile, and
    wherein the electrical connector is electrically coupled to an electrical connector disposed in another tile when the plate-to-plate connector of the tile interlocks to a plate-to-plate connector of an adjacent tile.

2. The tile of claim 1 wherein the tile comprises four male plate-to-plate connectors and four female plate-to-plate connectors to physically connect respective adjacent tiles.

3. The tile of claim 2 wherein two male plate-to-plate connectors are disposed on each of two adjacent edges and two female plate-to-plate connectors are disposed on each of another two adjacent edges.

4. A tile with display modules, comprising:
    a plate having a top side, a bottom side, and a plurality of through holes in the top side, wherein the bottom side comprises a plurality of recesses defined in part by a plurality of side walls each recess opening into a plurality of the through holes,
    a plurality of display modules, each display module removably received in a respective recess and having a plurality of light emitting elements,
    each of the plurality of light emitting elements positioned to emit light through at least one of the plurality of through holes when the display module is received in the respective recess, and
    at least two plate-to-plate connectors disposed at an edge of the plate and each plate-to-plate connector configured to physically connect the plate to an adjacent tile and each plate-to-plate connector having an electrical connector to electrically connect the plate to an adjacent tile.

5. The tile with display modules of claim 4 wherein the tile comprises four male plate-to-plate connectors and four female plate-to-plate connectors to physically connect respective adjacent tiles.

6. The tile with display modules of claim 5 wherein two male connectors are disposed on each of two adjacent edges and two female connectors are disposed on each of another two adjacent edges.

7. The tile with display modules of claim 4 wherein the electrical connectors comprise:
    a male electrical connector disposed in a female plate-to-plate connector disposed at an edge of the tile, and
    a female electrical connector disposed in a male plate-to-plate connector disposed at an edge of the tile, and
    wherein when the male plate-to-plate connector of the tile interlocks to a female plate-to-plate connector of an adjacent tile, the female electrical connector couples to the male electrical connector and two electrical cables of the two tiles are electrically connected.

8. The tile with display modules of claim 4 wherein the locations of the display module light emitting elements match the locations of the through holes of the plate.

9. The tile with display modules of claim 4 wherein the display module is flexible.

10. The tile with display modules of claim 4 wherein the display module is plastic coated and water resistant.

11. The tile with display modules of claim 4 wherein the display module is an LED module.

12. The tile with display modules of claim 4 wherein the tile comprises a power cable and a control cable.

13. A system of tiles with display modules, comprising:
    a plurality of tiles with display modules, each comprising:
        a plate having a top side, and a bottom side,
        wherein the bottom side comprises at least one recess,
        a plurality of through holes extending through the plate and opening into the at least one recess,
        at least two connectors disposed at an edge of the plate, wherein the connector is configured to interlock a connector of another tile,
        at least one display module, removably fitting into the recess and operationally emitting lights, and
        a cable, electrically and removably coupling to the display module, wherein the cable comprises two cable connectors configured to respectively couple to two connectors, and
    a power source controller, removably coupling to a cable connector of the tile and programmably controlling the display modules of the tiles,
    wherein the display module is able to emit lights through the through holes when the display module fits into the recess, and wherein the cable connector is electrically coupled to a cable connector disposed in another tile when the connector of the tile interlocks to a connector of an adjacent tile.

14. A system of tiles with display modules, comprising:
    a plurality of tiles with LED modules, each comprising:
        a plate having a top side, a bottom side, a first, second, third, and fourth edges, and a plurality of through holes, wherein the bottom side comprises seven double recesses and one single recess, the first and third edges are the opposite edges, and the second and fourth edges are the opposite edges,
        two T-shaped male connectors disposed at the first edge of the plate,
        two T-shaped male connectors disposed at the second edge of the plate,
        two female connectors disposed at the third edge of the plate and configured to receive a T-shaped male connector of another tile, two female connectors disposed at the fourth edge of the plate and configured to receive a T-shaped male connector of another tile, one single LED module, removably fitting into the single recess and operationally emitting lights, seven double LED modules, removably fitting into the double recesses and operationally emitting lights, wherein the LED modules are able to emit lights through the trough holes when the LED modules fit into the recesses, and wherein the LED modules are flexible, plastic coated and water resistant, and a cable, electrically and removably coupling to the LED modules, wherein the cable comprises a male cable connector and a female cable connector, the male cable connector is disposed in the female connector of the plate, the female cable connector is disposed in the male connector of the plate, and wherein the male cable connector is electrically coupled to an female cable connector of another tile when the female connector of the plate interlocks to an male connector of an adjacent tile, and a power source controller, removably coupling to a cable connector of the tile, providing power to the LED modules, and programmably controlling the display modules of the tiles, wherein the power source controller comprises a transformer module to covert AC into DC.

15. The tile of claim 1, wherein the plate includes a plurality of supports that extend from a top wall having the through holes down between the recesses to a support surface, such that the weight of the tile down to a support surface is supported from the top wall down through to the supports, without requiring the module to support any of the weight of the tile or anything on the tile.

16. The tile with display modules of claim 4, wherein the plate includes a plurality of supports that extend from a top wall having the through holes down between the recesses to a support surface, such that the weight of the tile down to a support surface is supported from the top wall down through to the supports, without requiring the modules to support any of the weight of the tile or anything on the tile.

17. The plate of claim 1, wherein the plate-to-plate connectors are integrally formed with the plate.

18. The plate of claim 4, wherein the plate-to-plate connectors are integrally formed with the plate.

19. The plate of claim 1, wherein the plate-to-plate connectors comprise two T-shaped male connectors disposed at one edge of the plate and two female connectors disposed at another edge of the plate and configured to receive a T-shaped male connector of another tile.

20. The plate of claim 4, wherein the plate-to-plate connectors comprise two T-shaped male connectors disposed at one edge of the plate and two female connectors disposed at another edge of the plate and configured to receive a T-shaped male connector of another tile.

\* \* \* \* \*